United States Patent
Jin et al.

(10) Patent No.: US 9,019,751 B2
(45) Date of Patent: Apr. 28, 2015

(54) PROCESS TOLERANT CIRCUITS

(71) Applicant: QUALCOMM Incorporated, San Diego, CA (US)

(72) Inventors: Peng Jin, San Diego, CA (US); Mohamed Hassan Abu-Rahma, San Diego, CA (US); Fahad Ahmed, San Diego, CA (US); Jaeyoon Kim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 131 days.

(21) Appl. No.: 13/781,759

(22) Filed: Mar. 1, 2013

(65) Prior Publication Data

US 2014/0247652 A1 Sep. 4, 2014

(51) Int. Cl.
| | |
|---|---|
| *G11C 5/00* | (2006.01) |
| *G05F 3/02* | (2006.01) |
| *G11C 7/00* | (2006.01) |
| *G11C 5/14* | (2006.01) |
| *G11C 11/419* | (2006.01) |

(52) U.S. Cl.
CPC .. *G05F 3/02* (2013.01); *G11C 7/00* (2013.01); *G11C 5/14* (2013.01); *G11C 11/419* (2013.01)

(58) Field of Classification Search
CPC ........ G11C 7/00; G11C 11/419; G11C 5/005; G11C 5/063; G11C 5/14; H05F 3/02
USPC .................................. 365/154, 226
See application file for complete search history.

(56) References Cited

U.S. PATENT DOCUMENTS

| | | | |
|---|---|---|---|
| 7,170,809 B2 | 1/2007 | Joshi | |
| 7,400,545 B2 * | 7/2008 | Ramaraju et al. | 365/227 |
| 7,626,852 B2 * | 12/2009 | Houston | 365/154 |
| 7,936,205 B2 | 5/2011 | Kong et al. | |
| 8,018,785 B2 * | 9/2011 | Yabuuchi et al. | 365/189.11 |
| 8,705,264 B2 * | 4/2014 | Rotem | 365/94 |
| 2007/0047364 A1 | 3/2007 | Chuang et al. | |
| 2008/0186791 A1 | 8/2008 | Lih et al. | |
| 2010/0128541 A1 | 5/2010 | Russell et al. | |

OTHER PUBLICATIONS

Khellah, et al., "PVT-variations and supply-noise tolerant 45nm dense cache arrays with Diffusion-Notch-Free (DNF) 6T SRAM cells and dynamic multi-Vcc circuits", VLSI Circuits, 2008 IEEE Symposium on, Publication Year: 2008 , pp. 48-49.
Lee, et al., "High-performance low-energy STT MRAM based on balanced write scheme", Proceeding ISLPED '12 Proceedings of the ACM/IEEE international symposium on Low power electronics and design, 2012, pp. 9-14.
Wang, et al., "Standby Supply Voltage Minimization for Reliable Nanoscale SRAMs", Chapter 6, Solid State Circuits Technologies, Book edited by: Jacobus W. Swart, ISBN 978-953-307-045-2, 2010, 22pgs.

(Continued)

*Primary Examiner* — Tan T. Nguyen
(74) *Attorney, Agent, or Firm* — Arent Fox LLP

(57) ABSTRACT

Various integrated circuits and methods of operating the integrated circuits are disclosed. The integrated circuit may include a circuit having one or more electrical parameters resulting from process variations during the manufacture of the integrated circuit, and a voltage source configured to supply a voltage to the circuit to power the circuit, wherein the voltage source is further configured to adjust the voltage as a function of the one or more electrical parameters.

25 Claims, 6 Drawing Sheets

(56) References Cited

OTHER PUBLICATIONS

International Search Report and Written Opinion—PCT/US2014/017771—ISA/EPO—Jun. 27, 2014.

Yamaoka M et al., "90-nm Process-Variation Adaptive Embedded SRAM Modules With Power-Line-Floating Write Technique", IEEE Journal of Solid-State Circuits, vol. 41, No. 3, Mar. 1, 2006, XP055124398, ISSN: 0018-9200, DOI:10.1109/JSSC.2006.869786, pp. 705-711.

* cited by examiner

PROCESS TOLERANT CIRCUITS

BACKGROUND

1. Field

The present disclosure relates generally to electronic circuits, and more particularly, to integrated circuits that are tolerant to process variations.

2. Background

Integrated circuits have revolutionized the electronic industry by enabling complex circuits consisting of millions of transistors, diodes, resistors and capacitors to be integrated into a chip of semiconductor material. Integration also provides other benefits such as batch manufacturing. The simultaneous manufacture of hundreds or even thousands of integrated circuits onto a single semiconductor wafer reduces cost and increases reliability of the end products.

Despite the manufacturing benefits of integrated circuits, process variations during the manufacturing process can have an impact on the electrical parameters of the chips, thereby leading to variations in performance. The nature of these process variations will be illustrated with reference to FIG. 1. FIG. 1 is a two-dimensional graph that is typically used to show the distribution of chip parameters for CMOS technology. Statistically, most of the CMOS chips will have electrical parameters that meet the nominal specifications. These CMOS chips will be plotted around the center 102 of the graph. A number of CMOS chips, however, will deviate from the nominal case towards the process corners. Referring to FIG. 1, each process corner is represented by a two-letter designation. The first letter refers to the NMOS transistors and the second letter refers to the PMOS transistors, and each letter has either an F designation for fast or an S designation for slow. The CMOS chips with both types of transistors being slow or fast will be plotted around the slow corner (SS) 104 or fast corner (FF) 106 respectively. There may also be CMOS chips that are plotted around cross corners where one type of transistor is faster and the other type of transistor is slower. By way of example, CMOS chips with slow NMOS transistors and fast PMOS transistors may be plotted around the slow-fast (SF) corner 108. CMOS chips with fast NMOS transistors and slow PMOS transistors may be plotted around the fast-slow (FS) corner 110. Preferably, all the CMOS chips manufactured on the semiconductor wafer can be plotted within the boundaries spanning the process corners. The performance of the CMOS chips that reside outside these boundaries cannot be guaranteed to operate properly under worst case conditions.

Memory is a common circuit implemented within an integrated circuit. A static random access memory (SRAM) is just one example. The SRAM is memory that requires power to retain data. Unlike dynamic random access memory (DRAM), the SRAM does not need to be periodically refreshed. The SRAM also provides faster access to data than DRAM making it an attractive choice for many integrated circuit applications. Unfortunately, chips operating at the SF corner tend to have difficulty writing to SRAM during normal operation.

The difficulty certain integrated circuits experience when operating at a process corner is of major concern to manufacturers. These concerns are not limited to the operation of SRAMs. Accordingly, there is a need in the art for circuits that are tolerant to process variations.

SUMMARY

One aspect of an integrated circuit includes a circuit having one or more electrical parameters resulting from process variations during manufacture of the integrated circuit, and a voltage source configured to supply a voltage to the circuit to power the circuit, wherein the voltage source is further configured to adjust the voltage as a function of the one or more electrical parameters.

One aspect of a method of supplying a voltage to a circuit manufactured on an integrated circuit, where the circuit has one or more electrical parameters resulting from process variations during the manufacture of the integrated circuit, includes adjusting the voltage supplied to the circuit as a function of the one or more electrical parameters.

Another aspect of an integrated circuit includes a circuit having one or more electrical parameters resulting from process variations during manufacture of the integrated circuit, and a voltage source configured to supply a voltage to the circuit to power the circuit, wherein the voltage source comprises means for adjusting the voltage as a function of the one or more electrical parameters.

A further aspect of an integrated circuit includes an SRAM having a power input, and a voltage source configured to supply a voltage to the power input of the SRAM, wherein the voltage source comprises a p-channel headswitch connected between a power supply and the power input of the SRAM, and a p-channel pull-down device connected to the p-channel headswitch, wherein the p-channel headswitch comprises a gate, and the voltage source further comprises a dummy voltage generator connected to the gate the p-channel headswitch and an n-channel transistor connected to the dummy voltage generator, wherein the dummy voltage generator is configured to generate a voltage having a capacitive load that emulates the capacitive loading on the voltage supplied to the SRAM.

It is understood that other aspects of apparatuses and methods will become readily apparent to those skilled in the art from the following detailed description, wherein various aspects of apparatuses and methods are shown and described by way of illustration. As will be realized, these aspects may be implemented in other and different forms and its several details are capable of modification in various other respects. Accordingly, the drawings and detailed description are to be regarded as illustrative in nature and not as restrictive.

BRIEF DESCRIPTION OF THE DRAWINGS

Various aspects of apparatuses and methods will now be presented in the detailed description by way of example, and not by way of limitation, with reference to the accompanying drawings, wherein.

DETAILED DESCRIPTION

Figure 1:
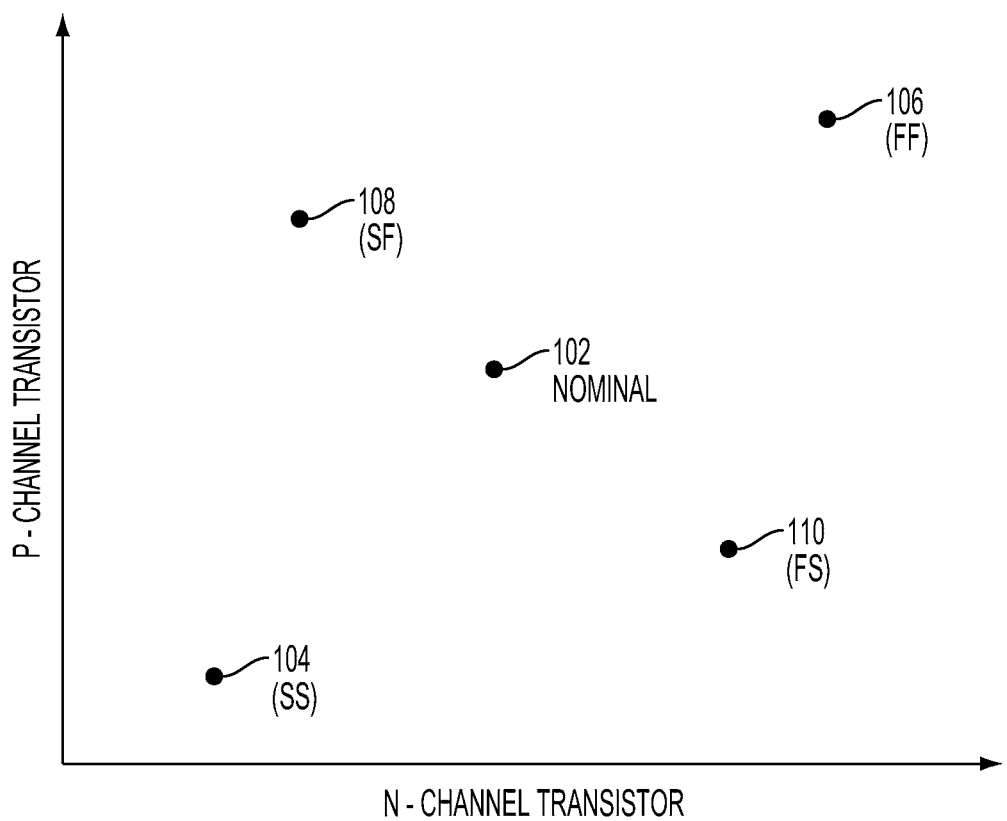
FIG. 1 is a graphical representation showing the distribution of the electrical parameters across CMOS chips manufactured on a single wafer.

Various aspects of the disclosure will be described more fully hereinafter with reference to the accompanying drawings. This disclosure may, however, be embodied in many different forms by those skilled in the art and should not be construed as limited to any specific structure or function presented herein. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of this disclosure, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure and/or functionality in addition to or instead of other aspects of this disclosure. It should be understood that any aspect of the disclosure disclosed herein may be embodied by one or more elements of a claim.

Although particular aspects will be described herein, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to different circuits, technologies, systems, networks, and methods, some of which are illustrated by way of example in the drawings and in the following description. The detailed description and drawings are merely illustrative of the disclosure rather than limiting, the scope of the disclosure being defined by the appended claims and equivalents thereof.

The various circuits described throughout this disclosure may be implemented in various forms of hardware. By way of example, any of these circuits, either alone or in combination, may be implemented as an integrated circuit, or as part of an integrated circuit. The integrated circuit may be an end product, such as a microprocessor, a digital signal processor (DSP), an application specific integrated circuit (ASIC), programmable logic, memory, or any other suitable integrated circuit. Alternatively, the integrated circuit may be integrated with other chips, discrete circuit elements, and/or other components as part of either an intermediate product, such as a motherboard, or an end product. The end product can be any suitable product that includes integrated circuits, including by way of example, a cellular phone, a personal digital assistant (PDA), a laptop computer, a desktop computer (PC), a computer peripheral device, a multimedia device, a video device, an audio device, a global positioning system (GPS), a wireless sensor, or any other suitable device.

Figure 2:
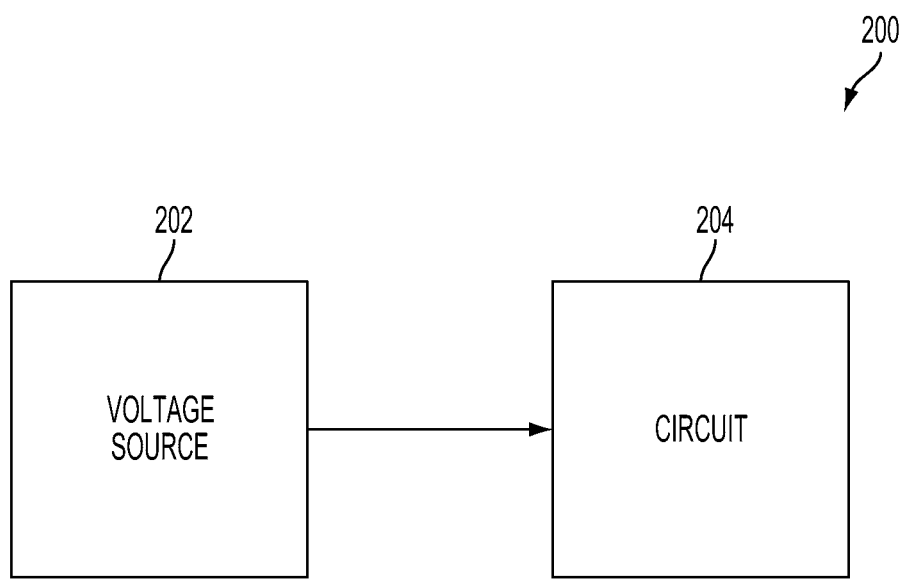
FIG. 2 is a functional block diagram illustrating one example of an integrated circuit.

FIG. 2 is a functional block diagram illustrating one example of an integrated circuit. The integrated circuit 200 is shown with a voltage source 202 and a circuit 204. The voltage source 202 is used to power the circuit 204. The circuit 204 may contain millions of transistors, diodes, capacitors and resistors manufactured on a semiconductor wafer. These components have certain process parameters such as channel length, oxide thickness, doping concentrations, etc., resulting from process variations during the manufacturing process. These process parameters have an effect on the strength and speed of the components, and thereby, the overall performance of the integrated circuit. In at least one embodiment of an integrated circuit, the voltage source 202 may be configured to adjust the voltage applied to the circuit 204 as a function of these process parameters to improve performance.

In the following detailed description, various aspects of an integrated circuit will be presented in the context of a voltage source that powers memory, such as an SRAM. While these aspects may be well suited for this application, those skilled in the art will realize that these aspects may be extended to other forms of hardware. By way of example, various aspects presented throughout this disclosure may be applied to a voltage source that powers random access memory (RAM), dynamic RAM (DRAM), static RAM (SRAM), double data rate RAM (DDRAM), read only memory (ROM), programmable ROM (PROM), erasable PROM (EPROM), electrically erasable PROM (EEPROM), cache, shift registers, buffers, any other suitable memories. Accordingly, any reference to a voltage source powering an SRAM is intended only to illustrate various concepts, with the understanding that such concepts may have a wide range of applications.

An SRAM includes an array of bit-cells with supporting circuitry to decode addresses and perform read and write operations. The array is arranged in rows and columns of bit-cells call called word-lines and bit-lines. Each bit-cell has a unique location or address defined by the intersection of a row and column. The number of bit-cells may be determined by a variety of factors including the size of the memory, the speed requirements of the memory, the layout and testing requirements, and the like. Typically, the array may include thousands of bit-cells.

Figure 3:
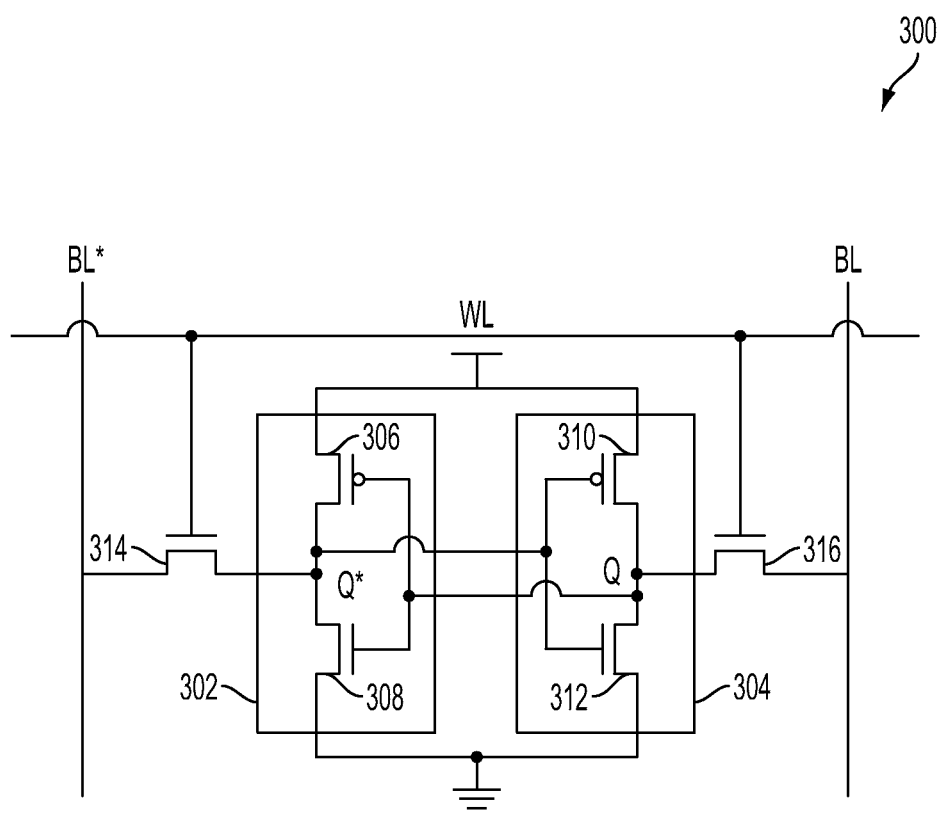
FIG. 3 is a schematic representation of a bit-cell for an SRAM.

FIG. 3 is a schematic representation of a bit-cell for an SRAM. The bit-cell is implemented with a six-transistor (6T) configuration. However, as those skilled in the art will readily appreciate, the bit-cell may be implemented with a four-transistor (4T), eight-transistor (8T), ten-transistor (10T), or any other suitable transistor configuration. The operation of the SRAM, as well as the voltage source, will be described in connection with two logic states represented by two voltage bands: one near the supply voltage $V_{CC}$ and one near the supply voltage return, typically ground. The terms "high," "logic level 1," and "pulled-up" may be used to reference the band near the supply voltage $V_{CC}$. The terms "low," "logic level 0," and "pulled-down" may be used to reference the band near the supply voltage return.

The bit-cell 300 is shown with two inverters 302, 304. The first inverter 302 comprises a p-channel pull-up transistor 306 and an n-channel pull-down transistor 308. The second inverter 304 comprises a p-channel pull-up transistor 310 and an n-channel pull-down transistor 312. The first and second inverters 302, 304 are interconnected to form a cross-coupled latch. A first n-channel access transistor 314 couples the latch to a first bit-line BL* and a second n-channel access transistor 316 couples the latch to a second bit-line BL. The gates of the n-channel access transistors 314, 316 are coupled to a word-line WL.

The read operation is initiated by precharging both the bit-lines BL, BL* to a logic level 1 and then asserting the word-line WL. The word-line WL is asserted by setting it high, thereby enabling both the access transistors 314, 316. With both the access transistors 314, 316 enabled, the value stored at the output Q* of the first inverter 302 is transferred to the first bit-line BL* and the value stored at the output Q of the second inverter 304 is transferred to the second bit-line BL. By way of example, if the value stored at the output Q is a logic level 0 and the value stored at the output Q* is a logic level 1, the first bit-line BL* will remain in its pre-charged state, while the second bit-line BL is pulled-down through the transistors 312, 316. If the value stored at the output Q is a logic level 1 and the value stored at the output Q* is a logic level 0, the first bit-line BL* is pulled-down through the transistors 308, 314 and the second bit-line BL will remain in its pre-charged state. Either way, the bit-lines BL, BL* are provided to a sense amplifier (not shown) which senses which line has the higher voltage to determine the state of the bit-cell 300.

The write operation is initiated by setting the bit-lines BL, BL* to the value to be written to bit-cell 300 and then asserting the word-line WL. By way of example, a logic level 1 may be written to the bit-cell 300 by setting the first bit-line BL* to a logic level 0 and the second lit-line BL to a logic level 1. The logic level 0 at the first bit-line BL* forces the output Q* of the first inverter 302 to a logic level 0 through the access transistor 314. The logic level 1 at the second bit-line BL forces the output Q of the second inverter 304 to a logic level 1 through the access transistor 316. The bit-line drivers (not shown) are designed to be stronger than the transistors in the bit-cell 300 so that they can override the previous state of the cross-coupled inverters 302, 304. The output Q* of the first inverter 302 is applied to the input of the second inverter 304, which reinforces the output Q of the second inverter 304 at a logic level 1. The output Q of the second inverter 304 is applied to the input of the first inverter 302, which reinforces the output Q* of the first inverter 302 at a logic level 0. A logic level 0 may be written to the bit-cell 300 by inverting the values of the bit-lines BL, BL*.

When the word-line WL is not asserted (i.e., a logic level 0), the access transistors 314, 316 disconnect the bit-lines BL, BL* from the two inverters 302, 304. The output state of the bit-cell 300 is maintained by the cross-coupling between the two inverters 302, 304.

A chip operating at the SF corner tends to have difficulty writing to SRAM. This is because the n-channel access transistors 314, 316 are weak and the p-channel transistors 306, 310 in the first and second inverters 302, 304, respectively, are strong. As a result, it is difficult for the first and second bit-lines BL*, BL to pull down the outputs Q*, Q of the first and second inverters 302, 304, respectively, to a logic level 0.

Figure 4:
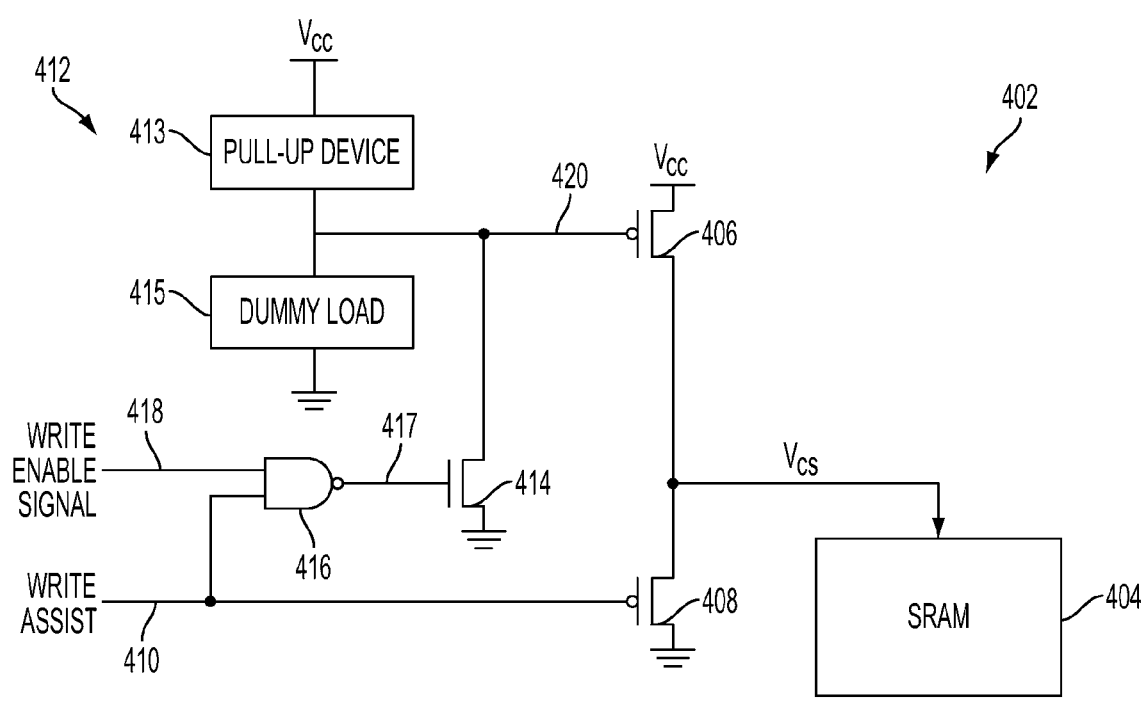
FIG. 4 is a schematic representation of a voltage source suitable to provide process tolerant write assist to an SRAM.

As described earlier in connection with FIG. 2, a voltage source may be used to adjust the voltage supplied to the SRAM to assist with a write operation. FIG. 4 is a schematic representation of a voltage source suitable to provide process tolerant write assist to an SRAM. The voltage source 402 is shown supplying a voltage $V_{CS}$ to power the SRAM 404. In this example, the voltage source 402 is shown powering the entire SRAM 404, but in practice, different power distribution schemes may be implemented. By way of example, multiple voltage sources may be used with each voltage source powering a column of bit-cells connected to the same write-line. Alternatively, the voltage source 402 may power an array of bit-cells connected to multiple word-lines, or all the bit-cells, either directly or through multiple drivers connected in a fan-out configuration. Accordingly, the term SRAM as used throughout this disclosure is intended to mean any grouping of bit-cells including a single bit-cell, a column of bit-cells or any portion thereof, a row of bit-cells or any portion thereof, an array of bit-cells within the SRAM, all the bit-cells within the SRAM, or any other grouping of any number of bit-cells, whether such grouping constitutes a portion of an SRAM memory bank, an entire SRAM memory bank, multiple SRAM memory banks, or any other bit-cell configuration. Those skilled in the art will be best suited to determine the optimal power distribution scheme for bit-cells based on the particular application and the overall design constraints imposed on the overall system.

In this example, the SRAM 404 may exhibit one or more electrical parameters resulting from process variations during the manufacturing process. By way of example, the SRAM may be operating at the SF corner. The voltage source 402 provides a means for adjusting the voltage supplied the SRAM 404 as a function of these one or more electrical parameters. The voltage source is shown with a headswitch 406 between the power supply $V_{CC}$ and the SRAM 404. The output of the headswitch 406 is used to provide a voltage $V_{CS}$ to power to SRAM 404. A means for pulling down the voltage $V_{CS}$ supplied to the SRAM is provided by a pull-down device 408 connected to the output of the headswitch 406. In this embodiment, both the headswitch 406 and the pull-down device 408 are p-channel transistors. A write assist signal 410 is provided to the gate of the pull-down device 408. A dummy voltage generator 412 is connected to the gate of the headswitch 406. The dummy voltage generator 412 may include a pull-up device 413 and a dummy load 415. The dummy load 415 may be configured to emulate the capacitive loading on the voltage $V_{CS}$ supplied to the SRAM 404. This may be achieved with a dummy load 415 comprising an arrangement of dummy bit-cells that are identical to the arrangement of SRAM bit-cells powered by the voltage $V_{CS}$. By way of example, when the voltage $V_{CS}$ is designed to power a column of bit-cells connected to the same write-line, the dummy load 415 may be implemented with a metal interconnect that extends the height of the column and connects the pull-up device 413 to the same number of dummy bit-cells arranged in a column. A pull-down device 414 is connected to the output of the dummy voltage generator 412. In this embodiment, the pull-down device 414 is an n-channel transistor. A logic gate 416 is used to control the pull-down device 414 connected to the output of the dummy voltage generator 412. The logic gate 416 may be a NAND gate having an output connected to the gate of the pull-down device 414. The NAND gate is used to gate a write enable signal 418 with the write assist signal 410.

Figure 5:
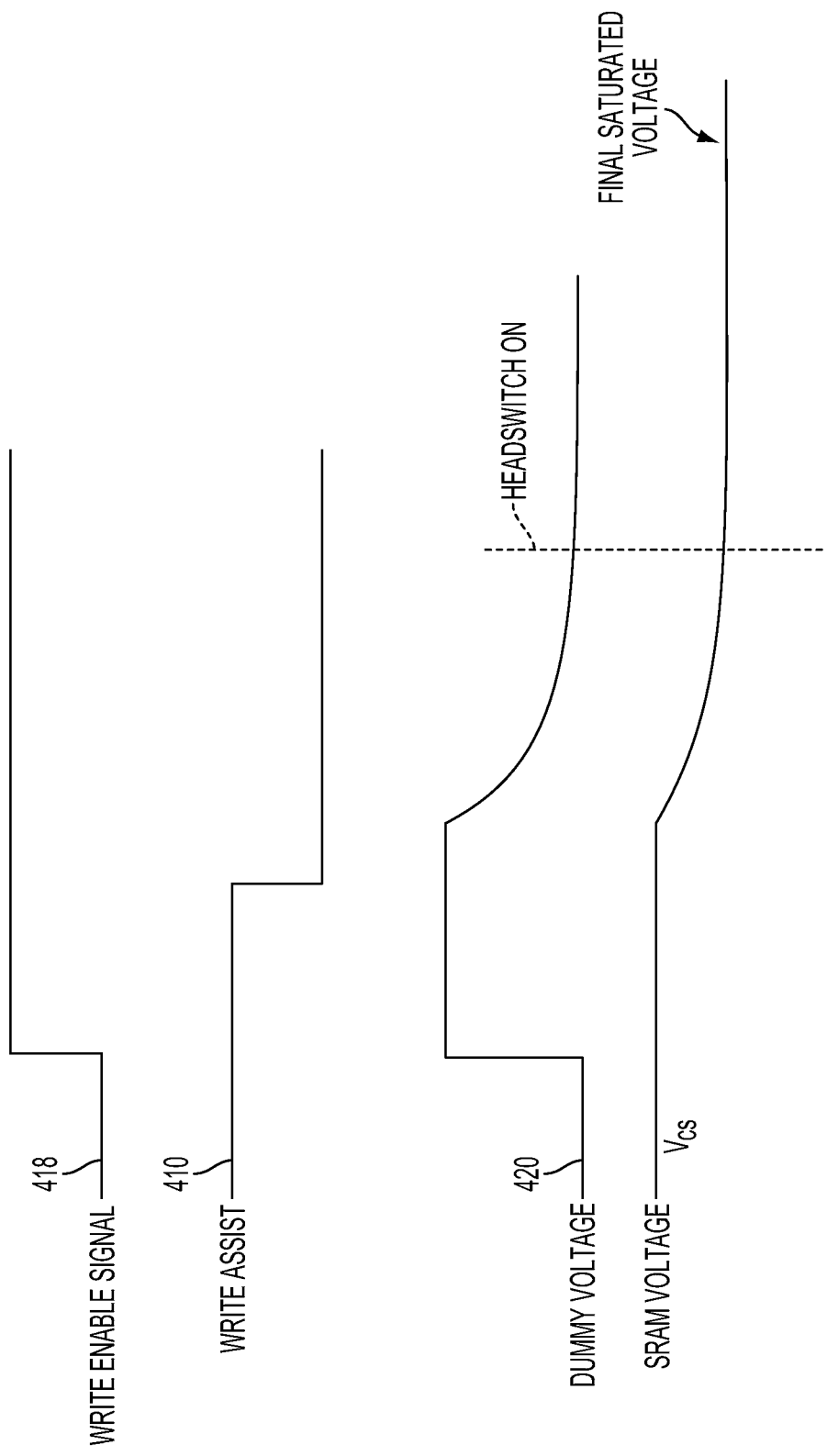
FIG. 5 is a timing diagram illustrating the operation of the voltage source presented in FIG. 4.

The voltage source 402 is configured to reduce the voltage $V_{CS}$ supplied to the SRAM 404 during the write operation. Reducing the voltage $V_{CS}$ can make the pull-up devices in the bit-cell 306, 310 (see FIG. 3) weaker, which assists the write operation. FIG. 5 is a timing diagram illustrating the operation of the voltage source. With reference to FIGS. 4 and 5, the initial state of the SRAM 404 is in the standby mode with the write assist signal 410 high and the write enable signal 418 low. This turns off the pull-down device 408 connected to the headswitch 406 and forces the output 417 of the NAND gate 416 high, which turns on the pull-down device 414. The output 420 from the dummy voltage generator 412 is pulled down through the pull-down device 414, which turns on the headswitch 406 to connect the power supply $V_{CC}$ to the SRAM 404.

The write operation is initiated by setting the write enable signal 418 high. This forces the output of the NAND gate 418 low, which turns off the pull-down device 414 connected to the output of the dummy voltage generator 412. The dummy voltage 420 is then precharged to the power supply voltage $V_{CC}$, which turns off the headswitch 406. The write assist signal 410 is then set low, which turns on the pull-down device 408 connected to the output of the headswitch 406. The voltage $V_{CS}$ at the output of headswitch 406 is then discharged through the pull-down device 408. The low write assist signal 410 also forces the output of the NAND gate 416 high, which turns the pull-down device 414 back on. The output 420 of the dummy voltage generator is then discharged through the pull down device 414 at a rate that tracks the rate the voltage $V_{CS}$ is discharged through the pull-down device 408. When the output of the dummy voltage generator 412 is sufficiently discharged, the headswitch 406 is turned back on. The voltage $V_{CS}$ supplied to the SRAM 404 then reaches a steady state voltage for the write operation based on the "on" resistance of the headswitch 406 and pull-down device 408.

This steady state voltage is determined by the size of the headswitch 406 relative to the pull-down device 408. Since both of these transistors are p-channel devices, the steady state voltage is not dependent on a process corner. The relative sizes of these transistors can be chosen so that the steady state voltage is above the data retention voltage of the SRAM 404.

In the described embodiment, the PMOS pull-down device 408 is turned on to pull down the voltage $V_{CS}$ supplied to the SRAM to begin the write operation. In this example, the head switch 406 is turned off before the PMOS pull-down device 408 is turned on to help discharge the voltage $V_{CS}$, and then turned back on by an NMOS pull-down device 414 to force the voltage $V_{CS}$ to the saturated voltage level. This approach improves the discharge time and reduces power. The dummy voltage may be used to track the load of the voltage $V_{CS}$ to fit different memory configurations. This ensures that the time to turn on the head switch 406 tracks the time to discharge the voltage $V_{CS}$.

Figure 6:
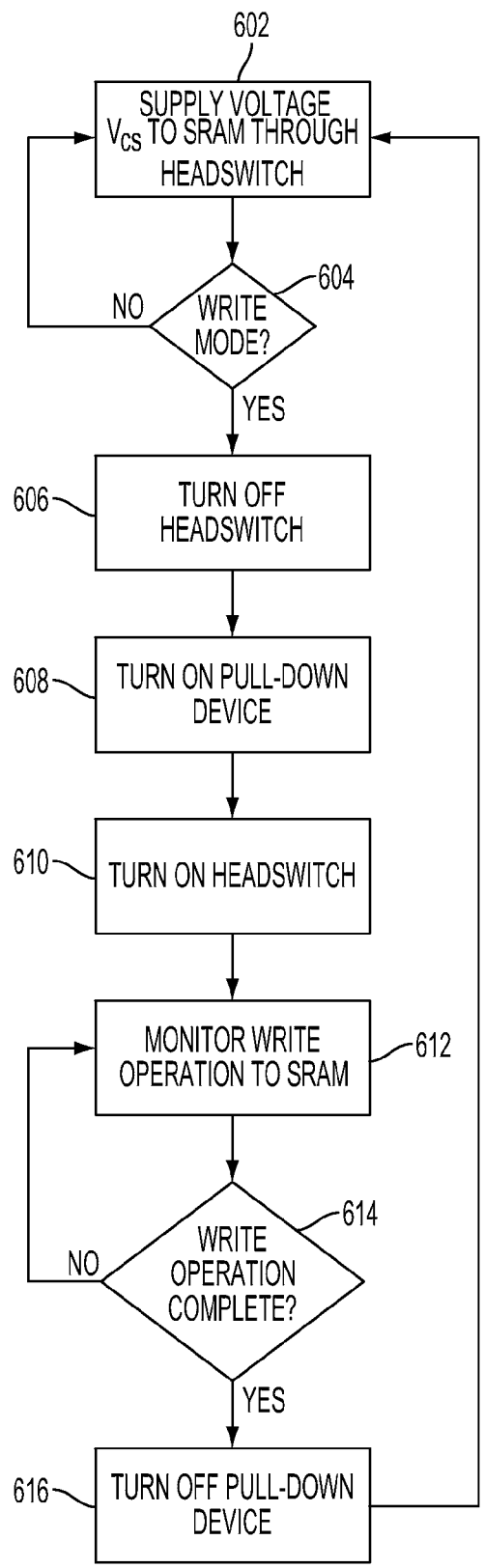
FIG. 6 is a flow chart illustrating the operation of the voltage source presented in FIG. 4.

FIG. 6 is a flow chart illustrating the operation of the voltage source, and more particularly, the adjustment of the voltage $V_{CS}$ supplied to the SRAM as a function of one or more electrical parameters resulting from process variations during the manufacture of the SRAM. Referring to FIGS. 4 and 6, the voltage $V_{CS}$ is supplied by the voltage source 402 to the SRAM 404 through the headswitch 406 when the SRAM 404 is in the standby mode. This function is represented by block 602 in FIG. 6. The voltage source 402 monitors the write enable signal 418 in block 604 to determine the beginning of the write cycle. The voltage source 402 continues to supply the voltage $V_{CS}$ through the headswitch 406 in block 602 as long as the write enable signal 418 remains unasserted (i.e., a logic level 0). Once the write enable signal 418 is asserted (i.e., a logic level 1), the voltage source 402 turns off the headswitch 406 in block 606 and then turns on the pull-down device 408 connected to the headswitch 406 in block 608. In block 610, the headswitch 406 is turned back on. In this example, the headswitch 406 is turned off before the pull-down device 408 is turned on to help discharge the voltage $V_{CS}$ more quickly, and then the headswitch 406 is turned back on to force the voltage $V_{CS}$ to the saturated voltage level. As described in greater detail earlier, the input circuitry to the headswitch 406 comprising the dummy voltage generator 412 and the pull-down device 414 provides the means for turning the headswitch 406 off and then back on. The time required to turn the headswitch back on is a function of the discharge time of the dummy voltage. The discharge time is a function of capacitive loading, which is designed to match the capacitive loading on the voltage $V_{CS}$. This ensures that the time to turn on the headswitch 406 tracks the time to discharge the voltage $V_{CS}$. The use of a n-channel pull-down transistor 414 at the input to the headswitch 406 means that more time is required to turn on the headswitch 406 in the SF corner, which can pull down the voltage $V_{CS}$ to an even lower level to assist writing to the SRAM.

In block 612, data may be written to the SRAM. The voltage source 402 monitors the write operation in block 614 until it is complete. Once the write operation is complete, the pull-down device 408 is turned off in block 616. The voltage $V_{CS}$ is then pulled up through the headswitch 406 to the power supply voltage $V_{CC}$. The voltage source 402 enters the standby mode and loops back to block 602 where it continues to supply voltage $V_{CS}$ to the SRAM 404 through the headswitch 406.

The various aspects of this disclosure are provided to enable one of ordinary skill in the art to practice the present invention. Various modifications to exemplary embodiments presented throughout this disclosure will be readily apparent to those skilled in the art, and the concepts disclosed herein may be extended to other magnetic storage devices. Thus, the claims are not intended to be limited to the various aspects of this disclosure, but are to be accorded the full scope consistent with the language of the claims. All structural and functional equivalents to the various components of the exemplary embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. An integrated circuit, comprising:
    a circuit having one or more electrical parameters resulting from manufacture of the integrated circuit; and
    a voltage source configured to supply a voltage to the circuit to power the circuit, wherein the voltage source is further configured to adjust the voltage as a function of the one or more electrical parameters,
    wherein the voltage source comprises a headswitch, and wherein the voltage is supplied to the circuit through the headswitch, and
    wherein the voltage source is further configured to adjust the voltage supplied to the circuit by turning on the headswitch at a time which is a function of a capacitive loading on the voltage supplied to the circuit.

2. The integrated circuit of claim 1 wherein the voltage source further comprises a pull-down device connected to the headswitch, and wherein the voltage supplied to the circuit is adjusted by turning on the pull-down device.

3. The integrated circuit of claim 2 wherein the voltage source is further configured to adjust the voltage supplied to the circuit by turning off the headswitch before the pull-down device is turned on.

4. The integrated circuit of claim 3 wherein the time to turn on the headswitch is after the pull-down device is turned on.

5. The integrated circuit of claim 2 wherein the adjusted voltage supplied to the circuit after the headswitch is turned on is a function of the on resistance of the headswitch and pull-down device, and is independent of the one or more electrical parameters.

6. The integrated circuit of claim 2 wherein each of the headswitch and pull-down device comprises a p-channel transistor.

7. The integrated circuit of claim 6 wherein the headswitch comprises a gate, the voltage source further comprising a dummy voltage generator coupled to the gate, the dummy voltage generator being configured to generate a voltage having a capacitive load that emulates the capacitive loading on the voltage supplied to the circuit.

8. The integrated circuit of claim 7 further comprising an n-channel transistor connected to the dummy voltage generator.

9. The integrated circuit of claim 1 wherein the circuit comprises an SRAM.

10. The integrated circuit of claim 9 wherein the voltage source is further configured to adjust the voltage supplied to the SRAM during a write operation to the SRAM.

11. A method of supplying a voltage to a circuit manufactured on an integrated circuit, the circuit having one or more electrical parameters resulting from the manufacture of the integrated circuit, the method comprising:

adjusting the voltage supplied to the circuit as a function of the one or more electrical parameters, wherein the voltage is supplied to the circuit through a headswitch, and wherein the adjusting the voltage supplied to the circuit further comprising turning on the headswitch at a time which is a function of a capacitive loading on the voltage supplied to the circuit.

12. The method of claim 11 wherein the adjusting of the voltage supplied to the circuit comprises turning on a pull-down device connected to the headswitch.

13. The method of claim 12 wherein the adjusting of the voltage supplied to the circuit further comprises turning off the headswitch before the pull-down device is turned on.

14. The method of claim 13 wherein the time to turn on the headswitch is after the pull-down device is turned on.

15. The method of claim 12 wherein the adjusted voltage supplied to the circuit after the headswitch is tuned on is a function of the on resistance of the headswitch and pull-down device, and is independent of the one or more electrical parameters.

16. The method of claim 11 wherein the circuit comprises an SRAM.

17. The method of claim 16 further comprising writing to the SRAM, wherein the adjusted voltage is supplied to the circuit during the write operation to the SRAM.

18. An integrated circuit, comprising:
a circuit having one or more electrical parameters resulting from manufacture of the integrated circuit; and
a voltage source configured to supply a voltage to the circuit to power the circuit, wherein the voltage source comprises means for adjusting the voltage as a function of the one or more electrical parameters,
wherein the voltage source comprises a headswitch, and the voltage is supplied to the circuit through the headswitch, and
wherein the means for adjusting the voltage comprises means to turn on the headswitch at a time which is a function of a capacitive loading on the voltage supplied to the circuit.

19. The integrated circuit of claim 18 wherein the means for adjusting the voltage comprises means for pulling down the voltage supplied to the circuit through the headswitch.

20. The integrated circuit of claim 19 wherein the means for adjusting the voltage comprises means for turning off the headswitch before the pull-down device is turned on.

21. The integrated circuit of claim 20 wherein the time to turn on the headswitch is after the pull-down device is turned on.

22. The integrated circuit of claim 19 wherein the adjusted voltage supplied to the circuit after the headswitch is turned on is a function of the on resistance of the headswitch and pull-down device, and is independent of the one or more electrical parameters.

23. The integrated circuit of claim 18 wherein the circuit comprises an SRAM.

24. The integrated circuit of claim 23 wherein the means for adjusting the voltage adjusts the voltage to the SRAM during a write operation to the SRAM.

25. An integrated circuit, comprising:
an SRAM having a power input; and
a voltage source configured to supply a voltage to the power input of the SRAM, wherein the voltage source comprises a p-channel headswitch connected between a power supply and the power input of the SRAM, and a p-channel pull-down device connected to the p-channel headswitch, wherein the p-channel headswitch comprises a gate, and the voltage source further comprises a dummy voltage generator connected to the gate the p-channel headswitch and an n-channel transistor connected to the dummy voltage generator, wherein the dummy voltage generator is configured to generate a voltage having a capacitive load that emulates the capacitive loading on the voltage supplied to the SRAM.

* * * * *